(12) United States Patent
Duggirala et al.

(10) Patent No.: US 6,766,501 B1
(45) Date of Patent: *Jul. 20, 2004

(54) SYSTEM AND METHOD FOR HIGH-LEVEL TEST PLANNING FOR LAYOUT

(75) Inventors: Suryanarayana Duggirala, San Jose, CA (US); Rohit Kapur, Cupertino, CA (US); Thomas W. Williams, Boulder, CO (US)

(73) Assignee: Synopsys, Inc., Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/217,490

(22) Filed: Aug. 12, 2002

Related U.S. Application Data

(63) Continuation of application No. 09/275,502, filed on Mar. 24, 1999, now Pat. No. 6,434,733.

(51) Int. Cl.[7] ............................................. G06F 17/50
(52) U.S. Cl. ............................... 716/11; 716/7; 716/8
(58) Field of Search ............................. 716/1, 2, 7, 8, 716/11, 4, 18; 714/726, 728, 729

(56) References Cited

U.S. PATENT DOCUMENTS

| | | | | |
|---|---|---|---|---|
| 5,323,400 A | * | 6/1994 | Agarwal et al. | 714/728 |
| 5,592,493 A | * | 1/1997 | Crouch et al. | 714/729 |
| 5,696,771 A | * | 12/1997 | Beausang et al. | 714/726 |
| 5,703,789 A | * | 12/1997 | Beausang et al. | 716/4 |
| 5,828,579 A | * | 10/1998 | Beausang | 716/2 |
| 5,943,490 A | * | 8/1999 | Sample | 703/28 |
| 6,106,568 A | * | 8/2000 | Beausang et al. | 716/18 |
| 6,434,733 B1 | * | 8/2002 | Duggirala et al. | 716/11 |

OTHER PUBLICATIONS

Narayanan et al., "Refigurable Scan Chains: A Novel Approach to Reduce Test Application Time," IEEE, Nov. 1993, pp. 710–715.*

Illman et al., "A Fragmented Resigter Architecture and Test Advisor for Bist," IEEE, 1994, pp. 124–129.*

Narayanan et al., "Reconfigurable Techniques for a Single Scan Chain," IEEE, Jun. 1995, pp. 750–765.*

* cited by examiner

*Primary Examiner*—Vuthe Siek
(74) *Attorney, Agent, or Firm*—Bever, Hoffman & Harms, LLP; Jeanette S. Harms

(57) ABSTRACT

A process and system for placement planning for test mode circuitry of an integrated circuit design. The novel method includes the steps of partitioning a scan chain of a netlist into sets of re-orderable scan cells. The netlist is passed to layout processes and therein the scan cells of the scan chain are re-ordered based on the sets. According to one embodiment of the present invention, the scan-chain is partitioned into a number of different sets based the respective clock domains, edge sensitivity types, skew tolerance levels, surrounding cone logic, reconfigurability and simultaneous output switching requirements of the scan cells. Data representative of the resulting sets are then provided to the place-and-route processes to be used as re-ordering limitations. Particularly, the re-ordering limitations restrict the rearrangement of scan cells among different sets. The placement and routing processes, however, are not restricted from rearranging the order of scan cells within the same set. The present invention thereby allows a better designed integrated circuit to be designed and fabricated.

26 Claims, 8 Drawing Sheets

SYSTEM AND METHOD FOR HIGH-LEVEL TEST PLANNING FOR LAYOUT

This application is a continuation of Ser. No. 09/275,502 filed Mar. 24, 1999 now U.S. Pat. No. 6,434,733.

FIELD OF THE INVENTION

The field of the present invention pertains to the field of electronic design automation. More particularly, the present invention pertains to test and floorplanning equivalent processes within the field of electronic design automation of integrated circuit devices.

BACKGROUND OF THE INVENTION

The rapid growth of the complexity of modern electronic circuits has forced electronic circuit designers to rely upon computer programs to assist and automate most steps of the circuit design process. Typical circuits today contain hundreds of thousands or millions of individual pieces or "cells." Such a design is much too large for a circuit designer or even an engineering team of designers to manage effectively manually. To automate the circuit design and fabrication of integrated circuit devices, electronic design automation (EDA) systems have been developed.

An EDA system is a computer software system designers use for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated by the EDA system into a lower level technology-specific netlist based on a technology-specific library that has gate-specific models for timing and power estimation. A netlist describes the IC design and is composed of nodes (elements) and edges, e.g., connections between nodes, and can be represented using a directed cyclic graph structure having nodes which are connected to each other with signal lines. The netlist is typically stored in computer readable media within the EDA system and processed and verified using many well known techniques. The netlist is then used to generate a physical device layout in mask form which can be used to directly implement structures in silicon to realize the physical IC device.

As ASICs and other complex integrated circuits have become more complex and more dense, they have become progressively harder to test in order to ensure correct and complete functionality. For example, with current technology, as the number of gates and transistors increase, the time which an ASIC spends in testing increases as well. This increase incurs an additional cost on ASIC manufacturing. The testing cost can be very significant for the latest and largest ASIC designs. In addition, as more complex systems-on-a-chip devices proliferate, which, for example, integrate complex logic units (integer units, floating point units, memory, etc.) into a single chip, and as newly-designed processors begin to take advantage of the ability to integrate large quantities of memory on-chip, it has become necessary to increase the comprehensiveness, efficiency, and accuracy of the design checking and testing schemes utilized to ensure proper operation of these devices (e.g., ASICs, complex integrated circuits, field programmable gate arrays, etc.).

Thus, an increasingly important part of the logic synthesis process involves designing for testability. Programs that aid in the testability process of logic synthesis are called design for test (DFT) processes. One approach to DFT is to take the netlist generated from a compiler and add and/or replace certain memory cells and associated circuitry with special memory cells that are designed to allow the application of test vectors to certain logic portions of the integrated circuit. The act of applying test vectors is called stimulation of the design, and the special memory cells and associated circuitry are referred to as DFT implementations. The same memory cells can be used to capture the output of the circuitry for observation and compare this output to the expected output in an effort to determine if circuit (e.g., manufacturing) defects are present. Issues concerning controllability deal with facilitating the application of the test vectors to the circuitry to be tested. On the other hand, issues concerning observability deal with facilitating the capturing the output of the circuitry.

The portions of an integrated circuit that are Designed to perform its intended or expected operational function are called its "mission mode" circuitry, while the portions added to the integrated circuit to facilitate testability are called "test mode" circuitry or DFT implementations. The resultant circuit, therefore, has two functional modes, mission and test.

An exemplary flow chart diagram of a typical design automation process, including a DFT process, is shown in FIG. 1. The process 100 described with respect to this flow chart is implemented within a computer system in a CAD environment. Within the process 100, a circuit designer first generates a high-level description 105 of a circuit in a hardware description language such as VHDL or Verilog. The high-level description 105 is then converted into a netlist 115 by using a computer implemented synthesis process 110 such as the "Design Compiler" by Synopsys, Inc., of Mountain View, Calif. A netlist 115 is a description of the electronic circuit which specifies what cells compose the circuit and which pins of which cells are to be connected together using interconnects ("nets"). At this point the netlist 115 consists of "mission mode" circuitry.

At block 120, a constraint-driven scan insertion process is performed to implement testability cells or "test mode" cells into the overall integrated circuit design. In this process 120, memory cells of the netlist 115 are replaced with scannable memory cells that are specially designed to apply and observe test vectors or patterns to and from portions of the integrated circuit. In addition, process 120 performs linking groups of scannable memory cells ("scan cells") into scan chains so that the test vectors can be cycled into and out of the integrated circuit design. The output of the scan insertion process 120 is a scannable netlist 125 that contains both "mission mode" and "test mode" circuitry.

The scannable netlist 125, however, does not contain any information with respect to the physical design of the circuit. For example, the netlist 125 does not specify where the cells are placed on a circuit board or silicon chip, or where the interconnects run. Determining this physical design information is the function of a computer controlled layout process 130.

The layout process 130 first finds a location for each cell on a circuit board or silicon chip. The locations are typically selected to optimize certain objectives such as wire length, circuit speed, power consumption, and/or other criteria, arid subject to the condition that the cells are spread evenly over the circuit board or silicon chip and that the cells do not overlap with each other. The layout process 130 also generates the wire geometry based on the placement information for connecting the pins of the cells together. The output of the automatic cell layout process 130 includes cell placement data structures and wire geometry data structures 135 that are used to make the final geometric database needed for fabrication of the circuit.

The layout of a typical design is not influenced by the test mode logic. Therefore, the layout process 130 in some cases may break up the scan chains and place the scan cells in such a way that the layout of the mission mode circuitry is not affected. The layout process 130 then reconnects the scan chain based on the placement of the scan cells. This process is also known as placement-based scan chain re-ordering.

Placement-based scan chain re-ordering works well in single clock domains, but does not work well in modem IC designs that have multiple clock domains or sequential elements that trigger on different clock edges (e.g., that have different edge sensitivities). Complications arise when a particular order is picked by the constraint-driven scan insertion process 120 and the layout process 130 violates the essence of this order. For example, scan insertion process 120 may configure a scan chain such that negative-edge triggered scan cells precede positive-edge triggered scan cells. In this case, placement-based scan chain re-ordering may mix memory cells with different clock edges, resulting in incorrect functionality of the circuit.

Accordingly, there exists a need for a process and system for placing and routing the test mode logic without significant impact to the layout of mission mode circuitry. What is also needed is a process and system for constructing scan chains that is not purely based on placement of the functional logic. What is yet further needed is a process and system for re-ordering scan cells that does not nullify ordering limitations predefined by DFT processes. The present invention provides these advantages and others not recited above but described in the following.

SUMMARY OF THE INVENTION

A computer implemented process and system are described for providing layout planning for test mode circuitry of an integrated circuit design. The present invention provides a floorplanning equivalent for test to take care of the link between test and layout to improve integrated circuit designs. The present invention feeds forward detailed information to the layout process to improve the ordering of scan cells that are determined during the layout process.

The novel process includes the steps of partitioning a scan chain into sets of re-orderable scan cells, and providing data representative of the sets of re-orderable scan cells to layout processes, e.g., placement and routing processes, as re-ordering limitations. Particularly, the re-ordering limitations restrict the rearrangement of scan cells among different sets. The placement and routing processes, however, are not restricted from rearranging the order of scan cells within the same set. In this manner, important test information can be forwarded to the layout processes to maintain selected scan cell orderings.

According to one embodiment of the present invention, the partitioning process divides the scan-chain into a number of sets based on clock domain information. If the scan chain includes lock-up latches, each set is further partitioned into a plurality of subsets based on the position of the lock-up latches. If the scan chain includes reconfigurable multiplexers, each subset containing reconfigurable multiplexer is further partitioned into smaller subsets based on the location of the reconfigurable multiplexer. In the present embodiment, the partitioning process may further divide the scan chain based on surrounding cone logic and SSO (Simultaneous Switching Outputs) requirements. Data representative of the resulting sets are then provided to the layout processes, e.g., place-and-route processes, to be used as re-ordering limitations.

Embodiments of the present invention include the above and further include an electronic design automation system comprising a logic synthesis system for receiving a HDL description of an integrated circuit design and for generating a scannable netlist based on the HDL description, wherein the logic synthesis process comprises a scan-insertion process for inserting a scan chain in the integrated circuit design; a scan chain partitioning system for partitioning the scan chain into a plurality of sets of re-orderable scan cells; and a place-and-route system for generating a layout from the scannable netlist, wherein the place-and-route system re-orders the scan chain to reduce routing congestion by only rearranging re-orderable scan cells within their respective sets.

Thus, by allowing the re-ordering of scan cells within only respective sets, the present invention provides for a method of placing and routing test mode logic that makes use of important test information to thereby reduce the impact of test mode logic on the layout of mission mode circuitry. In addition, any ordering limitations predefined by DFT processes will also be recognized by the present invention, and will be applied during placing and routing of the test mode logic. These and other advantages of the present invention not specifically mentioned above will become clear within discussions of the present invention presented herein.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE PREFERRED EMBODIMENTS

In the following detailed description of the preferred embodiments, for purposes of explanation, numerous specific details are set forth in order to provide a thorough understanding of the present invention. However, it will be apparent to one skilled in the art that the present invention may be practiced without these specific details. In other instances, well-known structures and devices are not described in detail in order to avoid obscuring aspects of the present invention.

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here and generally conceived to be a self-consistent sequence of steps of instructions leading to a desired result. The steps are those requiring physical manipulations of data representing physical quantities to achieve tangible and useful results. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving", "determining", "generating", "associating", "assigning" or the like, refer to the actions and processes of a computer system, or similar electronic computing device. The computer system or similar electronic device manipulates and transforms data represented as electronic quantities within the computer system's registers and memories into other data similarly represented as physical quantities within the computer system memories into other data similarly represented as physical quantities within the computer system memories or registers or other such information storage, transmission, or display devices.

Figure 1:
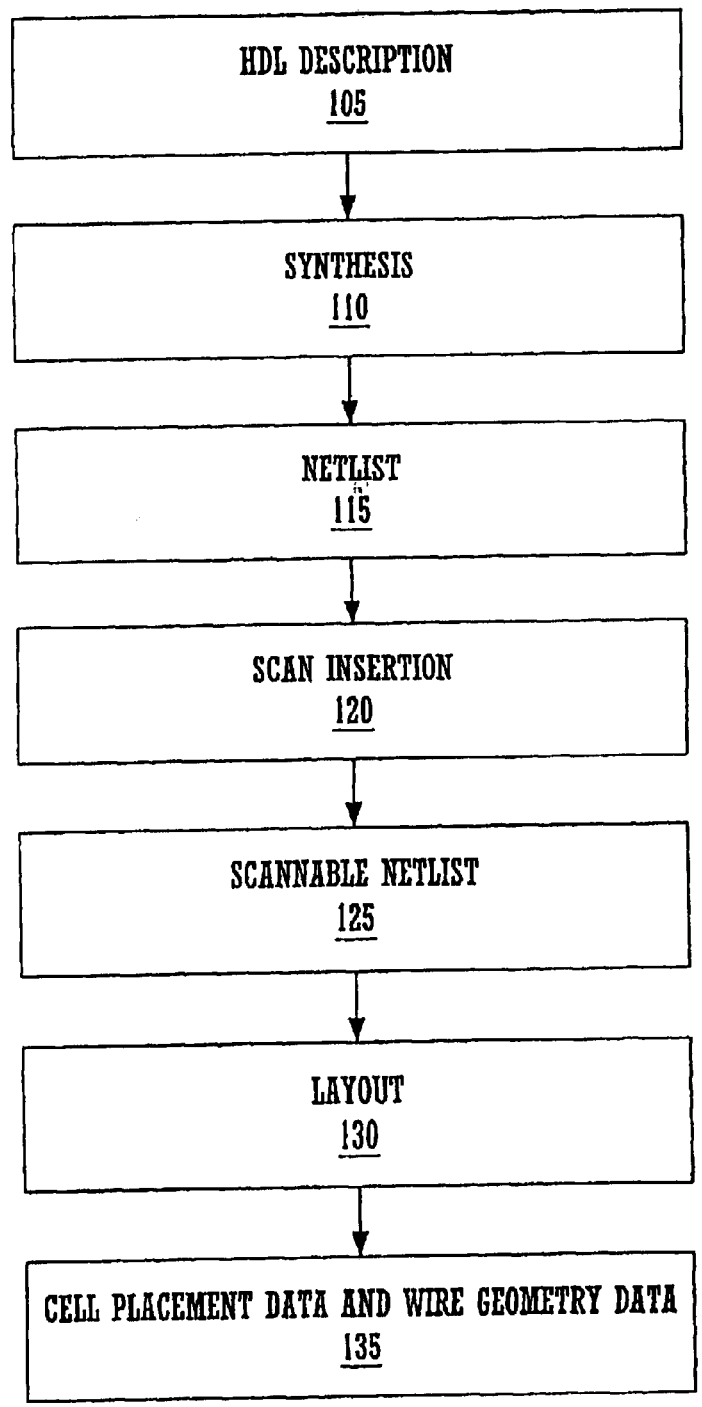
FIG. 1 is an exemplary flow chart diagram of a conventional logic synthesis process.
Figure 2:
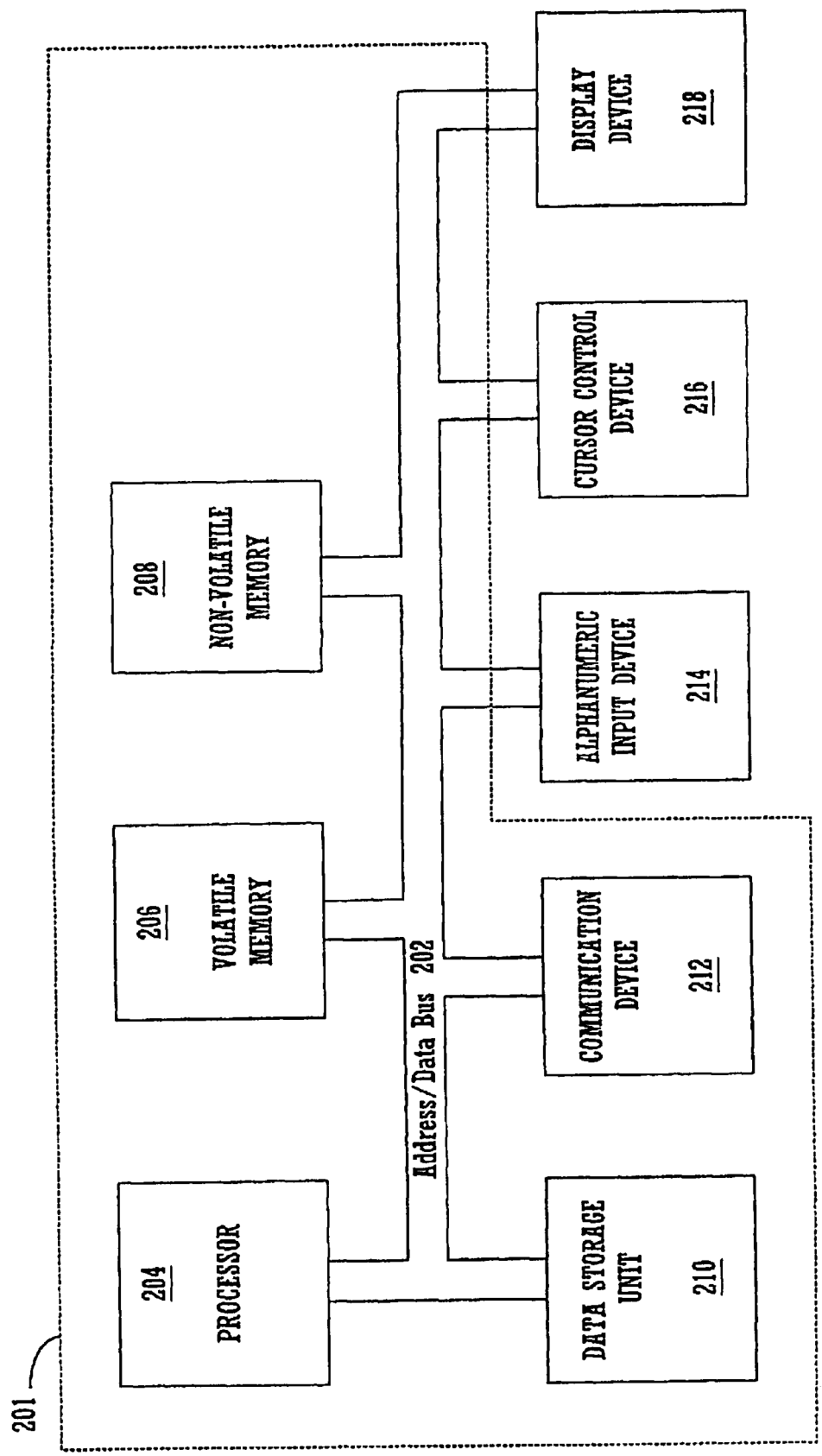
FIG. 2 is a computer-aided design (CAD) system including a computer system operable to implement the elements of the present invention.

Specific aspects of the present invention are operable within a programmed computer aided design (CAD) system. A CAD system operable as a platform to implement and support elements of the present invention is shown in FIG. 2. In general, the CAD system of the present invention includes a general purpose computer system 201 which includes an address/data bus 202 for communicating information including address, data, and control signals, a central processor 204 coupled with bus 202 for processing information and instructions, a volatile memory 206 (e.g., random access memory RAM) coupled with the bus 202 for storing information and instructions for the central processor 204 and a non-volatile memory 208 (e.g., read only memory ROM) coupled with the bus 202 for storing static information and instructions for the processor 204, a data storage device 210 such as a magnetic or optical disk and disk drive coupled with the bus 202 for storing information and instructions, an optional display device 218 coupled to the bus 202 for displaying information to the computer user, an optional alphanumeric input device 214 including alphanumeric and function keys coupled to the bus 202 for communicating information and command selections to the central processor 204, an optional cursor control or directing device 216 coupled to the bus 202 for communicating user input information and command selections to the central processor 204, and a communication device 212 coupled to the bus 202 for communicating signals that are input and output from the system 201.

Program instructions executed by the CAD system can be stored in computer usable memory units such as RAM 206, ROM 208, or in the storage device 210, and when executed in a group can be referred to as logic blocks or procedures. It is appreciated that data produced at the various logic synthesis stages of the present invention, including representations of the different levels of abstraction of the integrated circuit design, such as a netlist and or re-ordering limitations and/or sets of scan cells, can also be stored in RAM 206, ROM 208 or the storage device 210 as shown in FIG. 2.

The display device 218 of FIG. 2 utilized with the computer system 201 of the present invention is optional and may be a liquid crystal device, cathode ray tube, or other display device suitable for creating graphic images and alphanumeric characters recognizable to the user. The cursor control device 216 allows the computer user to dynamically signal the two dimensional movement of a visible pointer on a display screen of the display device 218. Many implementations of the cursor control device are known in the art including a trackball, mouse, joystick or special keys on the alphanumeric input device 214 capable of signaling movement of a given direction or manner of displacement.

Figure 3:
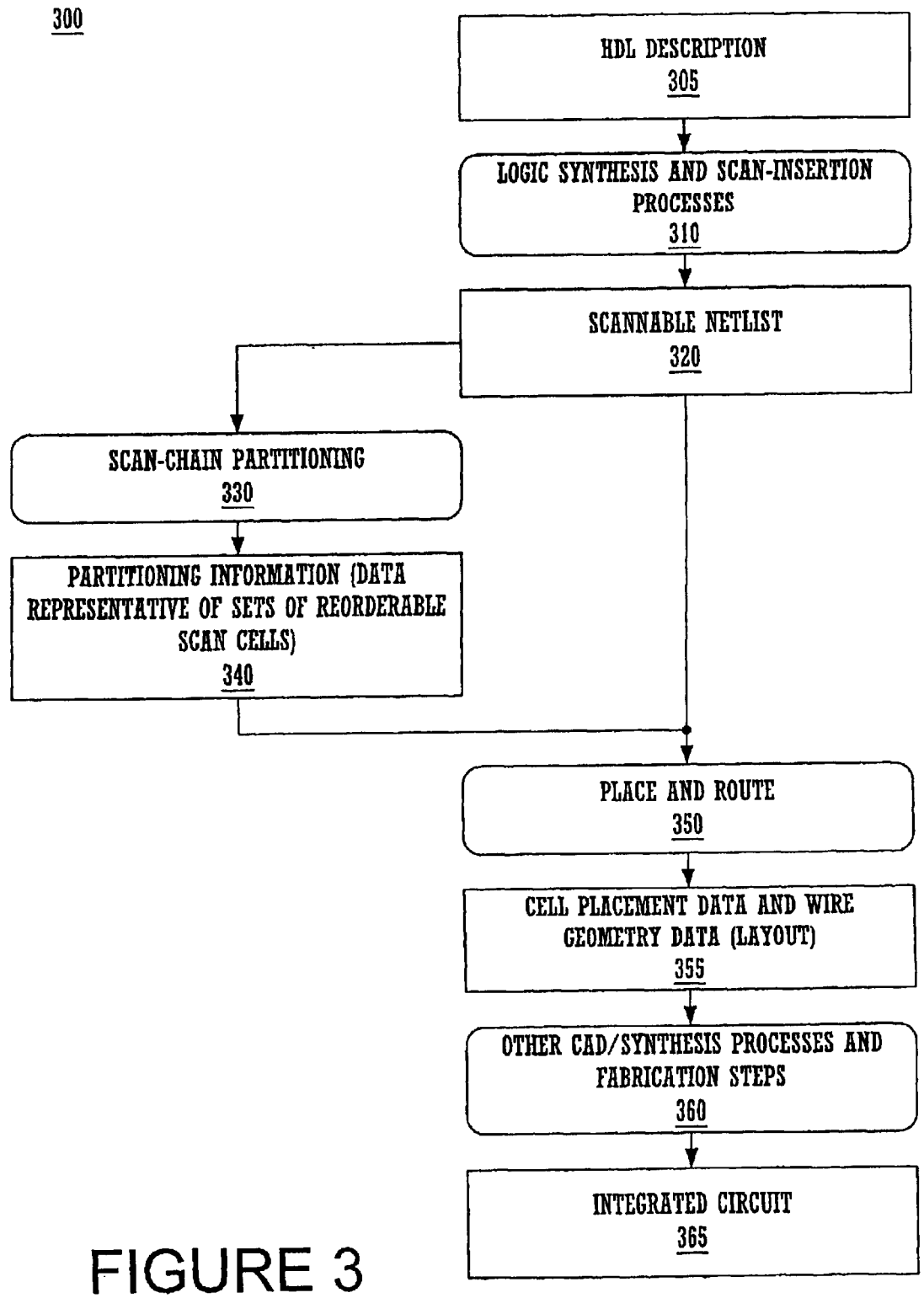
FIG. 3 is a flow chart diagram illustrating a test mode circuitry place-and-route process in accordance with the present invention.

FIG. 3 is a flow diagram of a process 300 in accordance with embodiments of the present invention and its logic blocks are implemented within the computer controlled CAD system described above. As illustrated, an HDL description 305 of an integrated circuit design is input into a synthesis and scan-insertion block 310. Synthesis processes of block 310 may include well known procedures such as HDL compiling procedures, logic optimization procedures, and mapping procedures.

Block 310 further includes scan-insertion processes (also called test insertion) for implementing testability cells or "test mode" cells into the overall integrated circuit design. In these process, memory cells of the design are replaced with scannable memory cells and other logic that are specially designed to apply and observe test vectors or patterns to and from portions of the integrated circuit. In one particular DFT process, these scannable memory cells specially designed for test are called scan cells. Scan-insertion processes of block 310 also perform linking groups of scan cells into respective scan chains so that the test vectors can be cycled into and out of the integrated circuit design. The output of the scan insertion processes is a scannable netlist 320 that contains both mission mode and test mode circuitry. It should be appreciated that the order of the scan cells within a scan chain is not arbitrary. Rather, a certain order may be imposed on the scan cells by the scan insertion processes.

The scannable netlist 320 is then input to the scan chain partitioning process block 330 of the present invention. A goal of process 330 is to identify sets of memory elements such that the order of the scan cells within that set does not matter. At one extreme, all scan memory elements can be included in a set within which the elements can be re-ordered in any fashion. This would be a typical solution where layout does not need to worry about test aspects of the design. At the other extreme, there are as many sets as there are memory elements in the design. That is, every memory element is in a different set for re-ordering. This set is the most restrictive from the layout perspective as no re-ordering can be done. One can view this example to be that the test requirements were so stringent that they dictated the ordering of the scan chain.

Particularly, the scan chain partitioning process block 330 partitions the scan chain based on clock domains, edge sensitivity types, skew tolerance levels, BIST (Built-In Self Test) cone logic feeding, and SSO (Simultaneous Switching Output) requirements of the scan cells. The result of the partitioning process 330 includes data representative of the sets of re-orderable scan cells 340. For simplicity, the data representative of the sets of re-orderable scan cells 340 is referred to as "partitioning information" 340.

Referring again to FIG. 3, the scannable netlist 320 and the partitioning information 340 are input into layout processes represented as a place-and-route process 350. The place-and-route process 350 first finds a coordinate location for each cell on a circuit board or silicon chip based on certain heuristics designed to minimize relationships impacting area, timing, etc. of the netlist circuit. The locations are selected to optimize certain objectives such as wire length, circuit speed, power consumption, and/or other criteria, and subject to the condition that the cells are routable, e.g., that the cells are spread evenly over the circuit board or silicon chip, and that the cells do not overlap with each other. Significantly, in accordance with the present invention, place-and-route process 350 is restricted from re-ordering scan cells among different sets of re-orderable cells. In other words, process 350 may only re-order the scan cells of the same set. The placement locations and wire geometry are optimized for the scan cells contained in the same set, and this is done for each set separately. The output of this placement and routing process 350 includes cell placement data structures and wire geometry data structures 355 of a properly ordered scan cells.

After the cell placement and wire geometry data structures 355 of the integrated circuit design are produced, other computer-aided design processes 360 continue until the integrated circuit design can be fabricated into an integrated circuit 365.

Figure 4A:
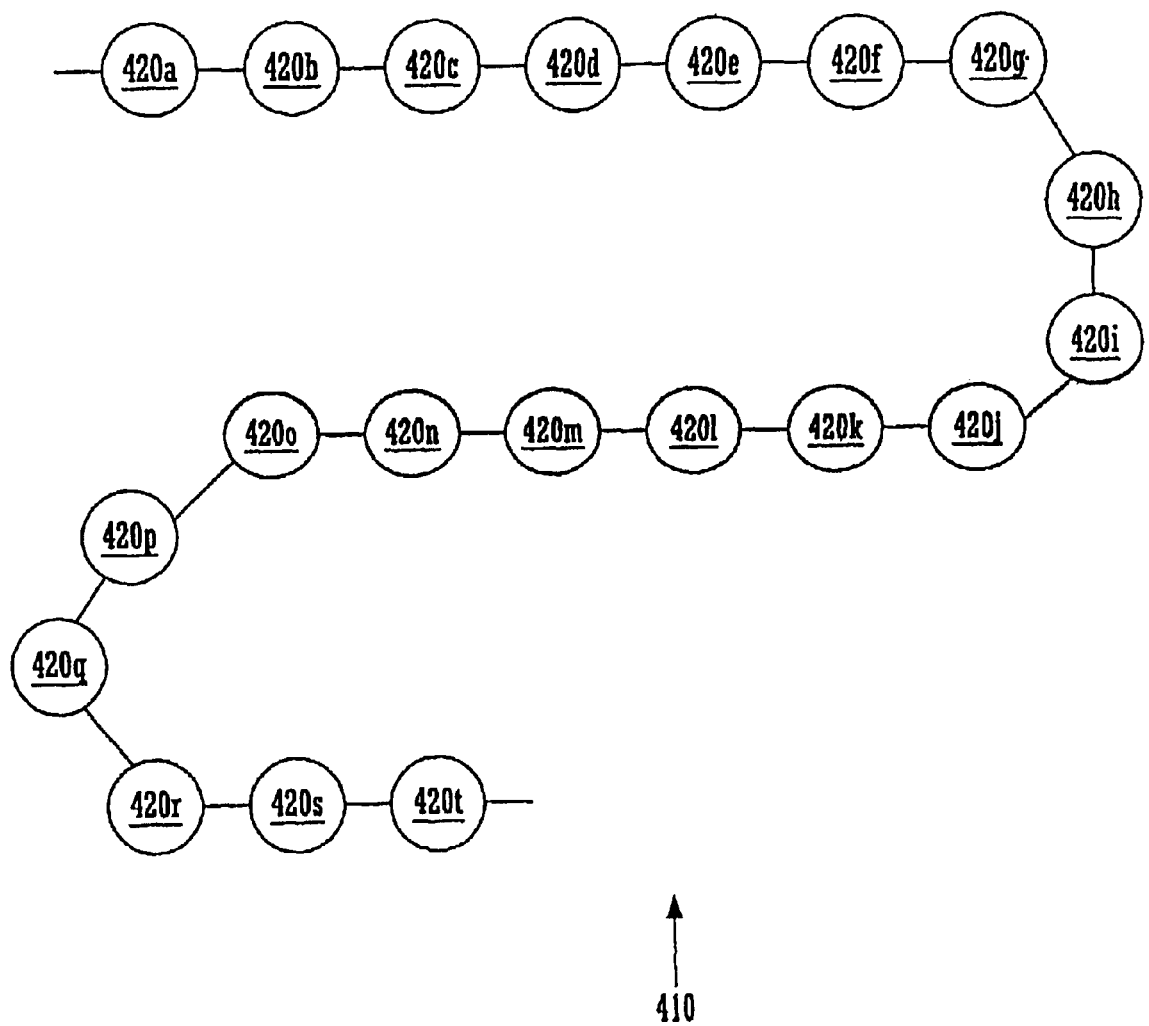
FIG. 4A is a logical block diagram of an exemplary scan chain on which the process according to the present invention can be applied.

FIG. 4A a logical block diagram illustrating an exemplary scan chain 410 before the scan chain partitioning process (e.g., process 330) according to the present invention is applied. As shown, scan chain 410 consists of twenty scan cells 420a–420t linked together to form a shift register configuration. For simplicity, the combinational logic surrounding the scan chain 410 is not illustrated.

Figure 4B:
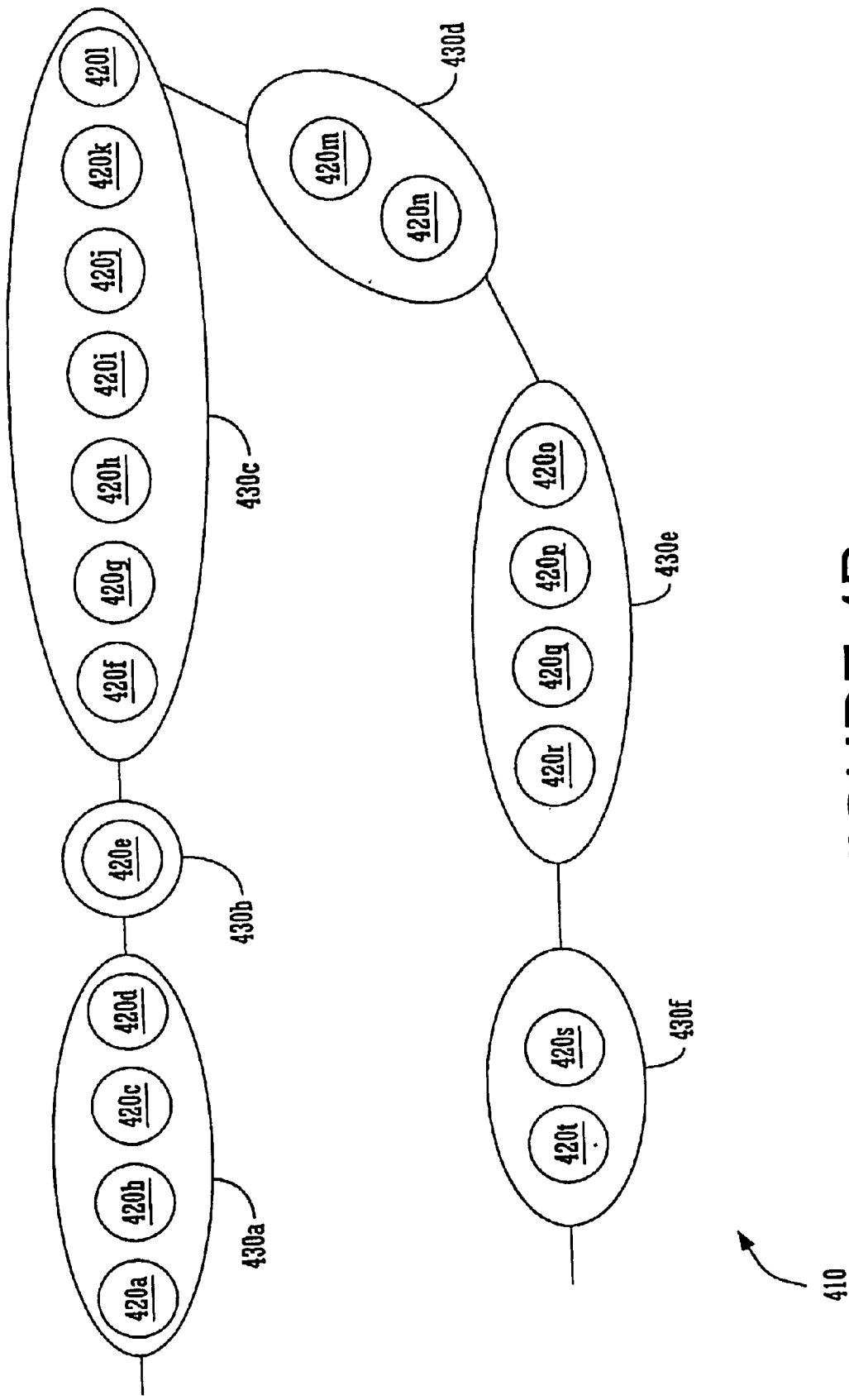
FIG. 4B is a logical block diagram of the exemplary scan chain shown in FIG. 4A after the partitioning process in accordance with the present invention.

FIG. 4B illustrates the scan chain 410 after the scan chain partitioning process according to the present invention is applied. As illustrated, scan chain 410 includes six sets of re-orderable scan cells. The first set 430a includes scan cells 420a–420d, the second set 430b includes scan cell 420e, the third set 430c includes scan cells 420f–420l, the fourth set 430d includes scan cells 420m–420n, the fifth set 430e includes scan cells 420o–420r, and the sixth set 430f includes scan cells 420s–420t. According to the present invention, the cells within each set 430a–430f are re-orderable among cells of the same set. Inter-set re-ordering, however, is not allowed. For example, the scan cells 420a–420d of the first set 430a may be re-ordered among themselves. Scan cells 420a–420d may not be-re-ordered with scan cells 420q of the fifth set 430e.

Figure 5A:
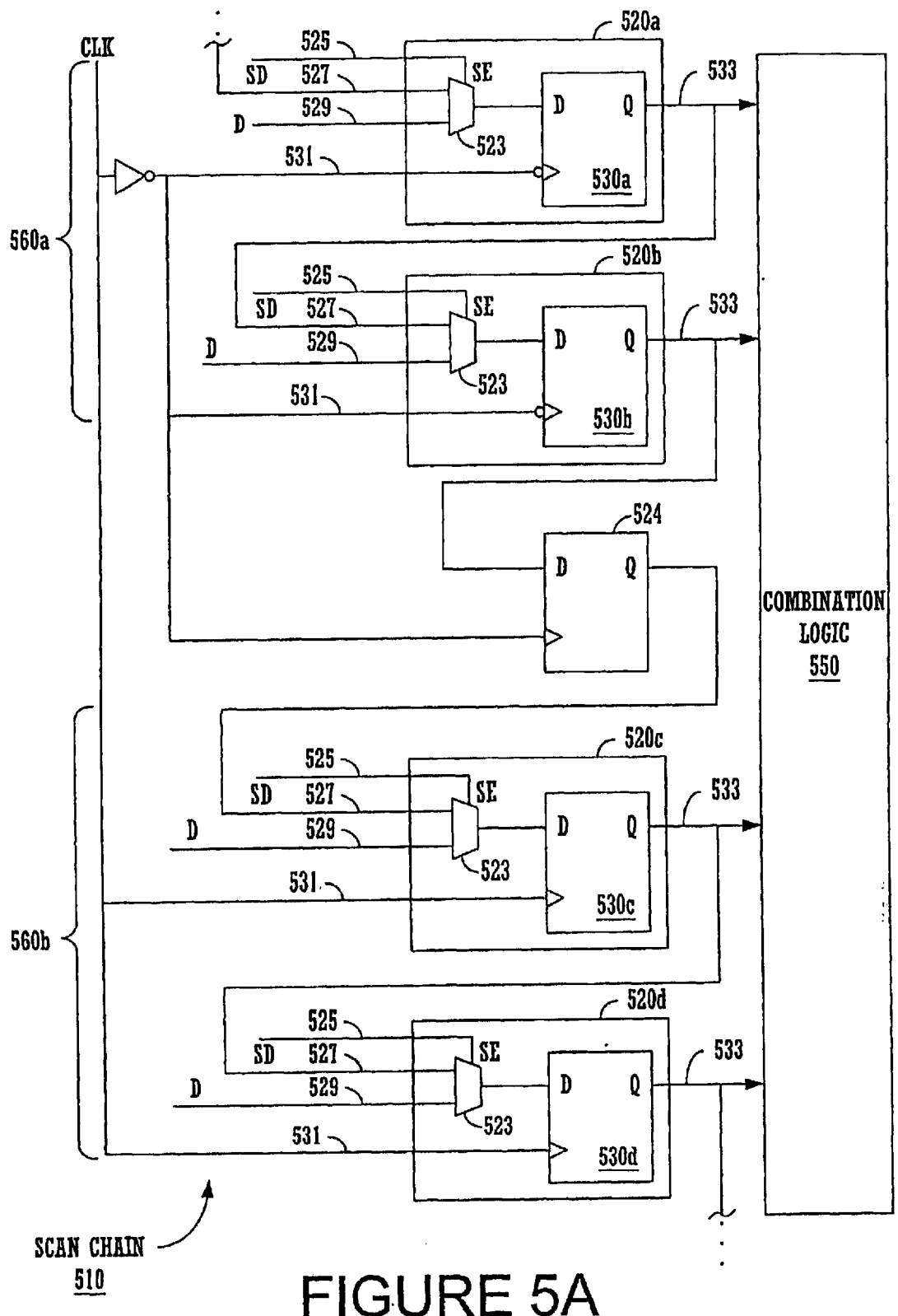
FIG. 5A is a logical block diagram of a segment of an exemplary scan chain on which the process according to the present invention can be applied.

FIG. 5A is a logical block diagram of an exemplary scan chain segment 510 on which the present invention can be applied. For simplicity, scan chain segment 510 is referred to herein as "scan chain" 510. As illustrated, the scan chain 510 includes scan cells 520a–520d and a lock-up latch 524 coupled between cells 520a–520b and cells 520c–520d. The scan cells 520a–520d in this example consist of multiplexed D input flip-flops which are linked together to form a shift register configuration.

In the illustrated example, the scan cells 520a–520d are analogous. Thus, for simplicity, only one cell 520a is described herein. The D input of the flip-flop 530a is coupled to the output of the multiplexer 523 which has a select line input 525, called the scan enable or SE line. The data inputs to the multiplexer 523 are an I input 529 and a SI shift input 527 which originates from a previous scannable memory cell, or from a primary input if the cell is the first cell in the scan chain 510. It is appreciated that the output of the mission mode logic or combination logic 550 is coupled to the I inputs 529 of the scan cells 520a–520d. Each of the cells 520a–520d also includes a CLK input line 531 for receiving a scan clock signal. The output 533 of cell 520a is routed to combination logic 550, and is also routed to the SI input 527 of another scannable memory cell 520b, or to a primary output, if the cell is the last cell of the scan chain 510. It is appreciated that Q or/Q output pin can be utilized in the chain configuration.

In the present exemplary scan chain 510, scan cells 520a–520b include positive-edge triggered flip-flops 530a–530b, and cells 520c–520d include negative-edge triggered flip-flips 530c–530d. The lock-up latch 524 is inserted in order to capture the output of cell 520b such that the output is available to the cell 520c at the negative edge of the next clock cycle. It would be advantageous to maintain the ordering of the negative-edge triggered scan cells 520a–520b and the positive-edge triggered scan cells 520c–520d in the physical design. The connection between cells 520a–520b and the connection between cells 520c–520d are less important.

Therefore, according to the present invention, scan chain 510 is partitioned into two sets 560a and 560b. Particularly, set 560a includes positive-edge triggered memory cells 520a–520b, and set 560b includes negative-edge triggered memory cells 520c–520d. Further, in the present embodiment, data representative of the sets 560a and 560b are stored in data structure 340 (FIG. 3) and are imposed on the layout processes 350 to prevent the re-ordering of scan cells among different sets. Layout process 350, however, are allowed to freely rearrange the order of the cells 520a–520b of set 560a, and the order of the cells 520c–520d of set 560b.

Figure 5B:
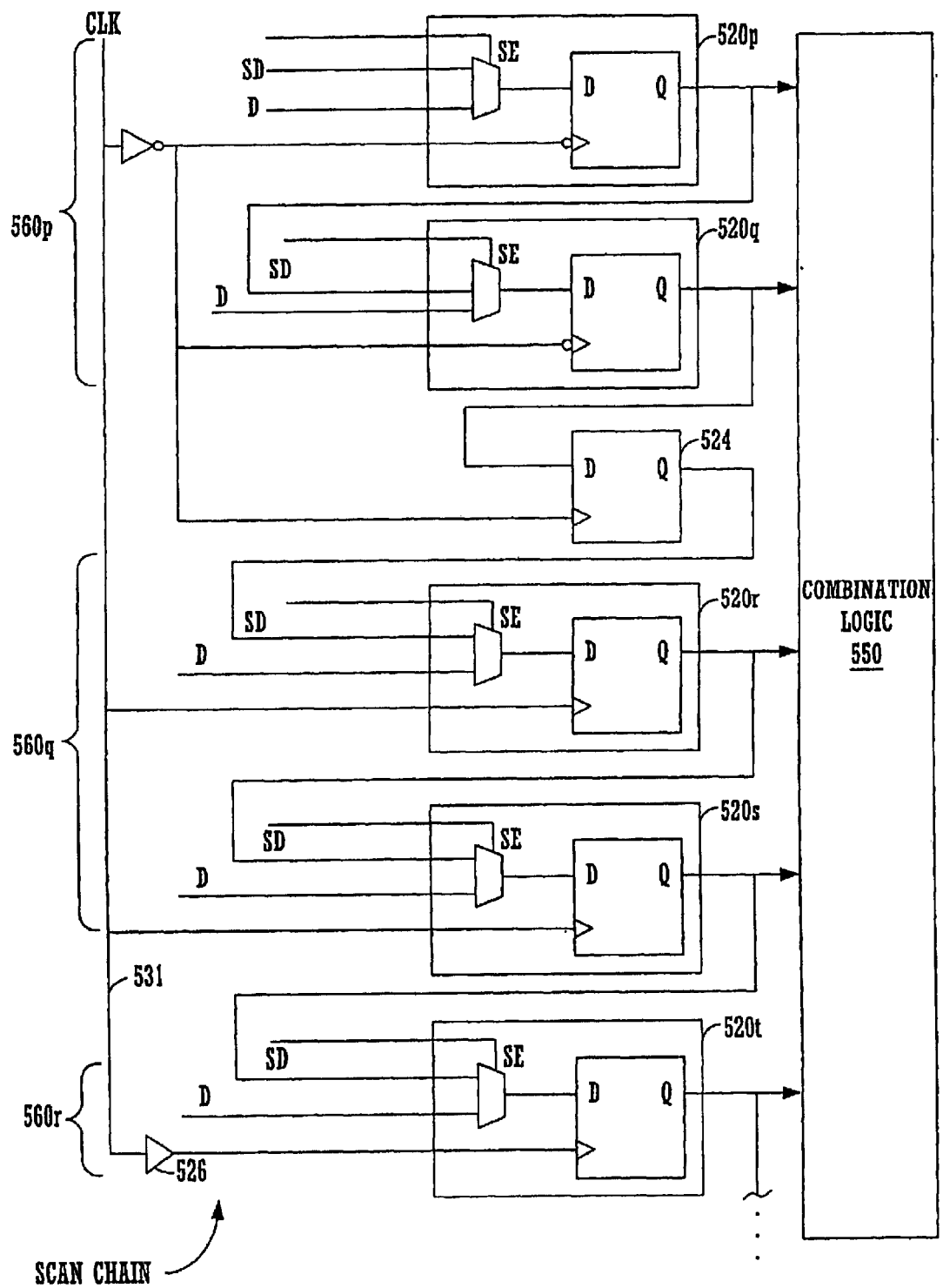
FIG. 5B is a logical block diagram of another segment of the exemplary scan chain on which the process according to the present invention can be applied.

FIG. 5B is a logical block diagram illustrating another scan chain segment 515 on which the present invention can be applied. As illustrated, the scan chain segment 515 includes scan cells 520p–520t which consist of multiplexed D input flip-flops linked together to form a shift register configuration. Also illustrated is clock buffer 524 which is inserted on the clock signal line 531 between cells 520s and 520t.

In the particular embodiment as illustrated, scan chain set 515 may be partitioned into three sets of scan cells: a first set 560p consisting of scan cells 520p–520q, a second set 560q consisting of scan cells 520r–520s, and a third set 560r consisting of scan cell 520t. According to the present embodiment, re-ordering constraints are imposed on the layout processes (e.g., process 350) to restrict the re-ordering of scan cells among different sets. According to the present invention, layout tools are allowed to freely re-order of the cells within their respective sets. The layout tools, however, may not rearrange the order of scan cells among different sets. For instance, scan cells within the first set 560p may not be interchanged with cells within the second set 560q or the third set 560r.

It should be appreciated that the scan chain segments 510 and 515 of FIGS. 5A and 5B are described for illustration purposes only, and that scan chains may be partitioned according to other criteria. For example, a scan chain may be partitioned based on the clock domain associated with each cell. If the scan chain includes reconfigurable multiplexers, the scan chain may be partitioned based on the position of the reconfigurable multiplexers. The scan chain may also be partitioned based on surrounding cone logic feeding and SSO (Simultaneous Switching Outputs) requirements of the scan cells. These alternative techniques are described below.

Figure 6:
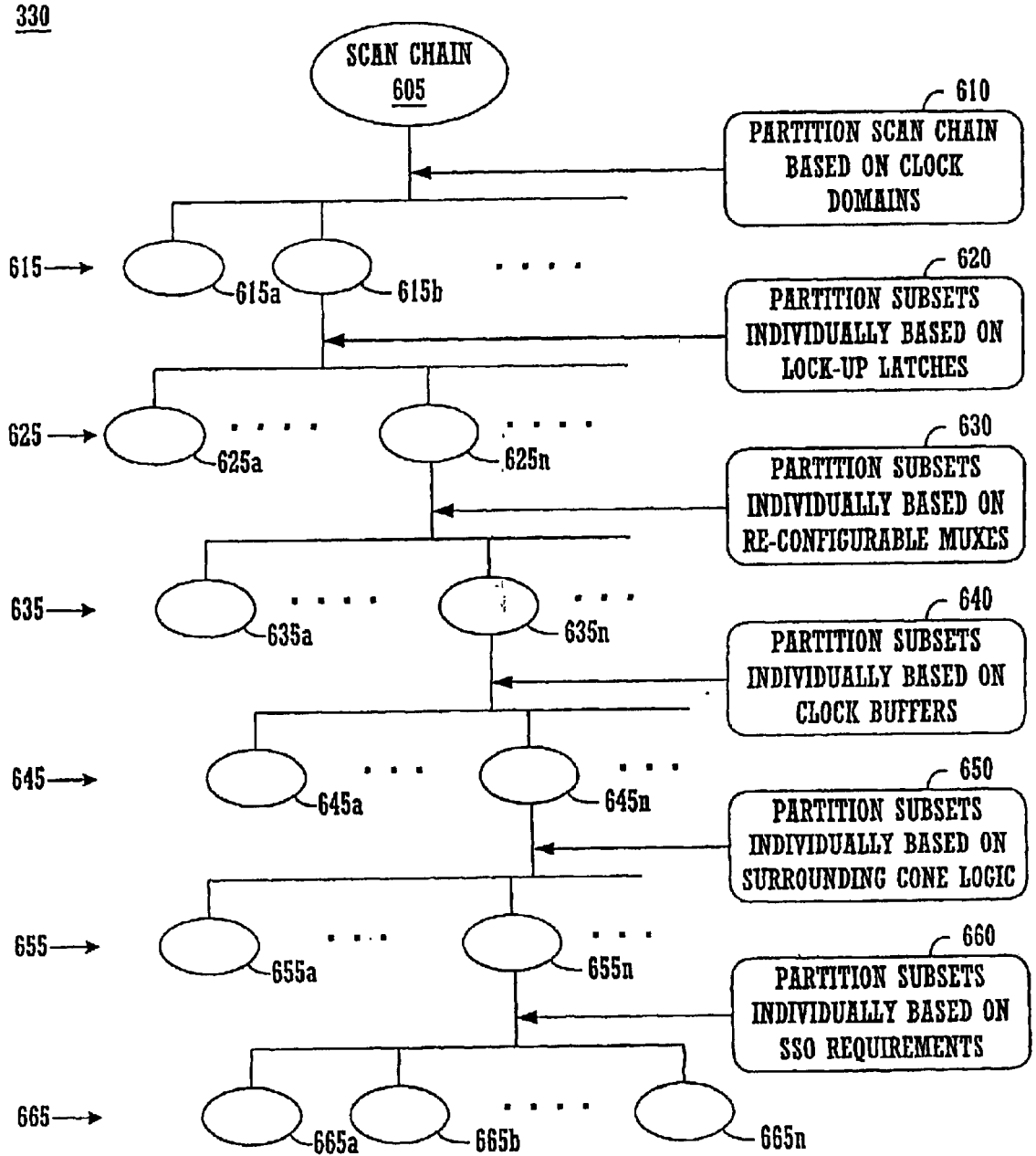
FIG. 6 is a flow chart diagram illustrating a process of partitioning a scan chain according to the present invention.

FIG. 6 is a flow chart diagram illustrating steps of scan chain partitioning process 330 according to the present invention. Process 330 can be implemented as program code stored in computer readable memory units of system 201 and executed on processor 204. In the following description, an exemplary scan chain 605 is partitioned to illustrate the process of the present invention. For simplicity, it is assumed that the scan chain 605 is generated by synthesis and scan insertion processes (e.g., process 310), and that the scan cells are initially arranged in an order dictated by such processes. The initial order is typically based on the hierarchical order of the netlist and/or based on clock constraints.

As illustrated in FIG. 6, at step 610, the scan chain 605 is partitioned into subsets 615 (including subsets 615a–615b) based on clock domain information. In the present embodiment, scan cells of each subset share a common clock domain. For instance, scan cells subset 615a may share a first clock domain, and scan cells of subset 615b may share a second clock domain. For simplicity, only two subsets are illustrated for each partitioning step. However, it should be appreciated that the number of subsets formed by each partitioning step is arbitrary.

The present invention recognizes that scan cells should be configured such that mixing of edges is minimized. To that end, synthesis and scan-insertion processes (e.g., process 310) may group scan cells of the same edge sensitivity type together, and may insert lock-up latches between different groups of scan cells having the same edge-sensitivity type. Therefore, routing should maintain the position of lock-up latches which are not typically visible by the layout process 350. According to the present invention, in order to forward such ordering information to layout processes, subsets 615 are individually partitioned based on the respective edge sensitivity types of the scan cells at step 620. Partitioning can be based on the positions of lock-up latches with respect to scan cells of the pertinent subset. As illustrated, smaller subsets 625 (including subsets 625a–625b), which are separated by lock-up latches, are formed as a result of the partitioning of one subset 615. It should be understood that all subsets 615 are similarly partitioned by step 620. However, only the ramification of partitioning one subset 615b is illustrated for simplicity.

Typically, multiplexers are used to reconfigure scan chains in different modes of operation. These reconfigurable multiplexers are, therefore, boundaries of different segments of the scan chain. In a BIST (Built-In Self Test) environment, the size of each segment should be maintained. Therefore, if the scan chain 605 includes reconfigurable multiplexers, it would be desirable to ensure that the layout process 350 maintains the connections of the reconfigurable multiplexers. Accordingly, at step 630, subsets 625 are individually partitioned according to the positions of re-configurable multiplexers with respect to scan cells of the pertinent subset. Also illustrated in FIG. 6 is one subset 625n that is partitioned into smaller subsets 635.

It is appreciated that, within the present invention, not all clocks have the same importance. For Instance, in Level Sensitive Scan Designs (LSSD), the system clock is more important than the B clock, which is in turn more important than the A clock. Therefore, in dealing with clock skew tolerance, step 640 may take the hierarchical relationship of the skew tolerance of the clocks into consideration when partitioning. According to the present invention, at step 640, subsets 635 are individually partitioned based on the skew tolerance levels of the scan cells. As illustrated, one subset 635n is partitioned into smaller subsets 645. Partitioning can be based on the positions of the clock buffers with respect to the scan cells of the pertinent set.

In a BIST (Built-In Self Test) environment, it is a desirable goal to avoid dependencies in values scanned into the scan chains that are fed by the same LFSR (Linear Feedback Shift Register). These dependencies are ignorable if scan chains feed independent logic. Therefore, it is desirable to partition the scan chains based on surrounding cone logic feeding. According to the present invention, at step 650, subsets 645 are individually partitioned based on the surrounding cone logic feeding associated with the scan cells of the pertinent set. As illustrated, step 650 partitions one subset 645n to form smaller subsets 655.

It is also desirable to place simultaneously switching cells on different power rails because the maximum amount of switching that happens in a design is typically during scan. Such requirements could limit the size of the partitions identified for re-ordering. Accordingly, at step 660, subsets 655 are individually partitioned according to simultaneously switching output (SSO) requirements of scan cells of the pertinent set. As illustrated, one subset 655b is partitioned into final sets 665a–665n at step 660. Data representative of the final sets 665a–665n are then provided to layout process 350 as partitioning information of the scan chain 605.

In furtherance of the present invention, the final sets 655 each contains scan cells that share the same clock domain, edge sensitivity type and skew tolerance level. In addition, the scan cells of each final set 655 are associated with the same reconfigurable multiplexers and the same surrounding cone logic. Furthermore, scan cells of each final set 655 meet the same SSO requirements. Accordingly, layout tools may freely re-order scan cells within each final set without violating the ordering limitations that are embodied within the initial order of the scan chain 605.

It should be appreciated that the order in which steps 610, 620, 630, 640, 650, and 660 of FIG. 6 are performed is immaterial. Rather, the aforementioned steps may be performed in an arbitrary order. For instance, scan chain partitioning step 660 based on SSO requirements may be performed prior to partitioning step 650. Furthermore, one or more of steps 610, 620, 630, 640, 650, and 660 may be omitted. Any permutations, combinations or variations of the above order should be construed to be different embodiments within the scope of the present invention. Table 1 below illustrates some examplary variations of the partitioning order in further of the present invention.

TABLE 1

| Variation 1 | Variation 2 | Variation 3 | Variation 4 | Variation 5 |
| --- | --- | --- | --- | --- |
| Step 610 | Step 620 | Step 610 | Step 620 | Step 660 |
| Step 630 | Step 630 | Step 620 | Step 630 | Step 650 |
| Step 640 | Step 640 | Step 640 | Step 640 | Step 640 |
| Step 620 | Step 650 | Step 650 | Step 660 | Step 630 |
| Step 660 | Step 660 | | | Step 620 |
| Step 650 | Step 610 | | | Step 610 |

Furthermore, according to the present invention, partitioning criteria (e.g., skew tolerance levels, edge sensitivity types, etc.) are applied to a scan chain to generate partitioning information specific to a scan chain, which is, in turn, provided to the layout processes as re-ordering limitations. Therefore, it should be appreciated that, other partitioning criteria within the spirit of the present invention, although not specifically mentioned, may also be applied.

It should also be appreciated that the present invention can implemented in a computer-aided design (CAD) system in any common computer languages such as C or C++. An exemplary computer implemented process for partitioning a scan chain is illustrated below in Table 2 in pseudocode.

TABLE 2

```
BEGIN SCAN CHAIN ORDER:
Create_basic_scan_chains_based_upon_clocking ( )
// To begin with the memory elements are ordered by clock domain into
// different scan chains. If the chain has to be ordered such that rising
// edge FFs need to be feeding trailing edge FFs lock-up latches are
// added.
List_of_re-orderable_sets = null;
For_Each_Scan_Chain_grow_the_re-orderable_sets ) i = 0; i < Num_scan_chains; I ++ ) {
    more_ffs_to_consider = scan_chain_ffs_as_partitioned_by_lockup_latches (i) ;
    while (more_ffs_to_consider ! = null) {
        set = null;
        reset_to_not_visted (design) ;
        while ( ( sizeof (set) < MAX) && (more-ffs-to-consider ) ) {
            for (j = 0; j < more_ffs_to_consider; j++) {
                count_primitives_not_visited_in_cone_fed_by_ff (i) ;
            } end for loop over remaining ffs of scan chain.
            if (set == null ) {
                ffselected = select_FF_that_feeds_largest_number_of_not_visited_primitives ( );
            }
            else {
                ffselected = select_FF_that_feeds_maximum_number_of_visited_primitives ( ) ;
            }
            set = set + ffselected;
            mark_forward_cone_of_ff_as_visited ( ffselected) ;
            more_ffs_to_consider = more_ffs_to_consider − ffselected;
        } end while loop to create a set.
        List_of_re-orderable_sets = List_of_re-orderable_sets + set;
    } end while loop over creating sets over ffs of a single scan chain.
} end for loop over scan chains.
```

The example in Table 2 starts from the most restrictive solution to create sets as large as possible under the constraints where the test issues are taken care of. However, there will be restrictions on the maximum size of the sets identified based upon balancing requirements of BIST and simultaneous switching concerns during scan.

The process grows the sets from the available list of scan cells in a scan chain, Once the sets are created, layout can reorder memory elements within the set. The final scan chains are composed of these sets of memory elements separated by buffers, MUXes, or lock-up latches.

The present invention, a computer implemented process and system for providing layout planning for test mode circuitry of an integrated circuit design, has thus been described. By partitioning a scan chain into re-orderable sets of scan cells, and by providing partitioning information to layout processes, test-related re-ordering constraints can be imposed during layout. It should be appreciated that the present invention may be implemented as a stand-alone software process for use in conjunction with conventional place-and-route tools, or may be implemented as a portion of a layout tool. While the present invention has been described in particular embodiments, it should also be appreciated that the present invention should not be construed as limited by such embodiments, but should be construed according to the below claims.

What is claimed is:

1. A computer implemented process for electronic design automation, said process comprising the steps of:

receiving a scannable netlist of an integrated circuit, said scannable netlist comprising a scan chain;

partitioning said scan chain into a plurality of sets of re-orderable scan cells, wherein partitioning information which describes the scan cells of each set is generated; and based on said partitioning information, re-ordering scan cells of said scan chain during layout processes of said integrated circuit design, said step of re-ordering only re-ordering scan cells of a same set.

2. The computer implemented process as recited in claim 1 wherein said step of partitioning further comprises the step of grouping scan cells of said scan chain into different sets based on their respective clock domains.

3. The computer implemented process as recited in claim 1 wherein said step of partitioning further comprises the step of grouping scan cells of said scan chain into different sets based on their respective edge sensitivity types.

4. The computer implemented process as recited in claim 1 wherein said step of partitioning further comprises the step of grouping scan cells of said scan chain into different sets based on their respective positions in relation to a reconfigurable multiplexer of said scan chain.

5. The computer implemented process as recited in claim 1 wherein said step of partitioning further comprises the step of grouping scan cells of said scan chain into different sets based on their respective clock skew tolerance levels.

6. The computer implemented process as recited in claim 1 wherein said step of partitioning further comprises the step of grouping scan cells of said scan chain into different sets based on their respective surrounding cone logic.

7. The computer implemented process as recited in claim 1 wherein said step of partitioning further comprises the step of grouping scan cells of said scan chain into different sets based on their respective output switching times.

8. A computer controlled electronic design automation system comprising:

a scan-insertion system for receiving a scannable netlist of an integrated circuit design, wherein said scan-insertion system inserts a scan chain of scan cells in said integrated circuit design;

a scan chain partitioning system for partitioning said scan chain into a plurality of sets of re-orderable scan cells and for reporting partitioning information indicative thereof; and a place-and-route system for generating a layout from said scannable netlist, said place-and-route system for re-ordering said scan cells of said scan chain based on said partitioning information by only re-ordering scan cells of a same set.

9. The computer controlled electronic design automation system as recited in claim 8 wherein said scan chain partitioning system forms said plurality of sets of re-orderable scan cells by grouping scan cells of said scan chain into different sets according to their respective clock domains.

10. The computer controlled electronic design automation system as recited in claim 8 wherein said scan chain partitioning system forms said plurality of sets of re-orderable scan cells by grouping scan cells of said scan chain according to their respective edge-sensitivity types.

11. The computer controlled electronic design automation system as recited in claim 8 wherein said scan chain partitioning system forms said plurality of sets of re-orderable scan cells by grouping scan cells of said scan chain according to their respective positions with respect to a reconfigurable multiplexer.

12. The computer controlled electronic design automation system as recited in claim 8 wherein said scan chain partitioning system forms said plurality of sets of re-orderable scan cells by grouping scan cells of said scan chain based on their respective clock skew tolerance levels.

13. The computer controlled electronic design automation system as recited in claim 8 wherein said scan chain partitioning system forms said plurality of sets of re-orderable scan cells by grouping scan cells of said scan chain based on their respective surrounding cone logic.

14. The computer controlled electronic design automation system as recited in claim 8 wherein said scan chain partitioning system forms said plurality of sets of re-orderable scan cells by grouping scan cells of said scan chain according to their output switching times.

15. A computer system comprising:

a processor coupled to a bus; and a computer readable memory unit coupled to said bus, said memory unit having a program stored therein causing said computer system to perform an electronic design automation process, said process comprising the steps of:

(a) receiving a scannable netlist of an integrated circuit design, said scannable netlist comprising a scan chain having serially ordered scan cells;

(b) partitioning scan chain into a plurality of sets of re-orderable scan cells and generating partitioning information indicative thereof;

(c) providing said scannable netlist and said partitioning information to a layout process; and (d) said layout process re-ordering said scan cells of said scan chain based on said partitioning information by only re-ordering scan cells of a same set.

16. The computer system as recited in claim 15 wherein said step (b) of said process further comprises the step of grouping scan cells of said scan chain into different sets based on their respective clock domains.

17. The computer system as recited in claim 15 wherein said step (b) of said process further comprises the step of grouping scan cells of said scan chain into different sets based on their respective edge sensitivity types.

18. The computer system as recited in claim 15 wherein said step (b) of said process further comprises the step of grouping scan cells of said scan chain into different sets based on their respective positions in relation to a reconfigurable multiplexer of said scan chain.

19. The computer system as recited in claim 15 wherein said step (b) of said process further comprises the step of grouping scan cells of said scan chain into different sets based on their respective clock skew tolerance levels.

20. The computer system as recited in claim 15 wherein said step (b) of said process further comprises the step of grouping scan cells of said scan chain into different sets based on their respective surrounding cone logic.

21. The computer system as recited in claim 15 wherein said step (b) of said process further comprises the step of grouping scan cells of said scan chain into different sets based on their respective output switching times.

22. A method of constructing a scan chain comprising the steps of:

a) adding scan cells to a netlist description of an integrated circuit design, said scan cells being coupled serially together to form a first scan chain having a scan cell ordering;

b) partitioning said scan cells of said first scan chain into sets of scan cells and generating partitioning information indicative thereof, said step b) comprising the steps of:

b1) partitioning said scan cells of said first scan chain into sets according to a first characteristic of said scan cells wherein scan cells of a given set share the same first characteristic; and b2) partitioning scan cells of said sets of step b1) into subsets according to a second characteristic of said scan cells wherein scan cells of a given subset share the same second characteristic and the same first characteristic; and c) constructing a second scan chain by breaking said scan cell ordering of said first scan chain and reordering said scan cells based on said partitioning information wherein only scan cells of a same subset are allowed to be reordered.

23. The method as described in claim 22 wherein said step c) is performed during placing and routing processes performed on said netlist description.

24. The method as described in claim 23 wherein said step b) further comprises the step of partitioning scan cells of said subsets of step b2) into subsets according to a third characteristic wherein scan cells of a given share the same third characteristic, second characteristic, and first characteristic.

25. The method as described in claim 23 wherein said first characteristic includes a clock domain and said second characteristic includes an edge sensitivity.

26. The method as described in claim 23 wherein characteristics include two of edge sensitivity, clock domain, positions of reconfigurable multiplexers, skew tolerance, surrounding cone logic feeding, and simultaneously switching output (SSO) requirements.

* * * * *

UNITED STATES PATENT AND TRADEMARK OFFICE
CERTIFICATE OF CORRECTION

PATENT NO. : 6,766,501 B1
DATED : July 20, 2004
INVENTOR(S) : Suryanarayana Duggirala et al.

It is certified that error appears in the above-identified patent and that said Letters Patent is hereby corrected as shown below:

Column 14,
Line 54, insert -- subset -- after "given".

Signed and Sealed this

Twenty-third Day of August, 2005

JON W. DUDAS
*Director of the United States Patent and Trademark Office*

US006766501C1

(12) EX PARTE REEXAMINATION CERTIFICATE (5998th)
United States Patent
Duggirala et al.

(10) Number: US 6,766,501 C1
(45) Certificate Issued: *Nov. 6, 2007

(54) SYSTEM AND METHOD FOR HIGH-LEVEL TEST PLANNING FOR LAYOUT

(75) Inventors: Suryanarayana Duggirala, San Jose, CA (US); Rohit Kapur, Cupertino, CA (US); Thomas W. Williams, Boulder, CO (US)

(73) Assignee: Synopsys, Inc., Mountain View, CA (US)

( * ) Notice: This patent issued on a continued prosecution application filed under 37 CFR 1.53(d), and is subject to the twenty year patent term provisions of 35 U.S.C. 154(a)(2).

Reexamination Request:
No. 90/007,869, Jan. 9, 2006

Reexamination Certificate for:
Patent No.: 6,766,501
Issued: Jul. 20, 2004
Appl. No.: 10/217,490
Filed: Aug. 12, 2002

Disclaimer of Claims 1 to 24 Filed Sep. 22, 2006 (O.G., Nov. 7, 2006)

This patent is subject to a terminal disclaimer.

Certificate of Correction issued Aug. 23, 2005.

Related U.S. Application Data

(63) Continuation of application No. 09/275,502, filed on Mar. 24, 1999, now Pat. No. 6,434,733.

(51) Int. Cl.
*G06F 17/50* (2006.01)

(52) U.S. Cl. ................................. 716/11; 716/7; 716/8

(58) Field of Classification Search .................... 716/1, 716/2, 7, 8, 11, 4, 18; 714/726, 728, 729
See application file for complete search history.

(56) References Cited

U.S. PATENT DOCUMENTS

| 5,726,996 A | 3/1998 | Chakradhar et al. |
| 5,812,561 A | 9/1998 | Giles et al. |
| 5,983,376 A | 11/1999 | Narayanan et al. |
| 6,067,650 A | 5/2000 | Beausang et al. |

OTHER PUBLICATIONS

Beausang, James, et al., "Integrating Scan Into Hierarchical Synthesis Methodologies," IEEE International Test Conference 1996, 751–756.
S. Barbagallo et al. "Scan Insertion Criteria for Low Design Impact", Proc IEEE VLSI Test Symposium, 1996, consisting of 7 pages.

(Continued)

*Primary Examiner*—Kwang B. Yao

(57) ABSTRACT

A process and system for placement planning for test mode circuitry of an integrated circuit design. The novel method includes the steps of partitioning a scan chain of a netlist into sets of re-orderable scan cells. The netlist is passed to layout processes and therein the scan cells of the scan chain are re-ordered based on the sets. According to one embodiment of the present invention, the scan-chain is partitioned into a number of different sets based the respective clock domains, edge sensitivity types, skew tolerance levels, surrounding cone logic, reconfigurability and simultaneous output switching requirements of the scan cells. Data representative of the resulting sets are then provided to the place-and-route processes to be used as re-ordering limitations. Particularly, the re-ordering limitations restrict the rearrangement of scan cells among different sets. The placement and routing processes, however, are not restricted from rearranging the order of scan cells within the same set. The present invention thereby allows a better designed integrated circuit to be designed and fabricated.

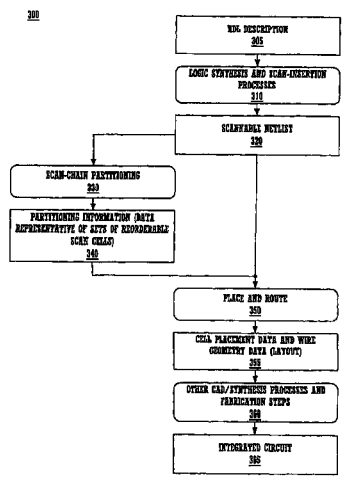

OTHER PUBLICATIONS

S. Barbagallo et al "Layout–driven Scan Chain Partitioning and Reordering", IEEE European Test Workshop, 1996, consisting of 3 pages.

Lin et al. "Layout–driven Chaining of Scan Flip–Flops", IEEE Proc. Comput. Digit. Tech., vol. 143, No. 6, Nov. 1996, pp. 421–425.

Chen et al. "Layout Driven Selecting and Chaining of Partial Scan Flip–Flops", 33rd Design Automation Conference Jun. 1996, consisting of 6 pages.

Hirech et al. "A New Approach to Scan Chain Reordering Using Physical Design Information", IEEE Proceedings of the ProceedingsInternational Test Conference, 1998 pp. 348–355.

Kobayashi et al. "A VLSI Scan–Chain Optimization Algorithm for Multiple Scan–Paths", IEICE Trans. Fundamentals, vol. E82–A, No. 11 Nov. 1999, pp. 2499–2504.

K.D. Boese et al. "Scan Chain Optimization: Heuristic and Optimal Solutions", Internal Report, UCLA CS Dept., Oct. 1994, pp. 1–19. Available at http://citeseer.csail.mit.edu.

Cirasella et al. "The Asymmetric Traveling Salesman Problem: Algorithms, Instance Generators, and Tests", ALENEX 2001 Proceedings, Springer Lecture Notes in Computer Science 2153, pp. 32–59.

Berthelot et al. "An Efficient Linear Time Algorithm For Scan Chain Optimization and Repartitioning", ITC International Test Conference, IEEE 2002, pp. 781–787.

S. Barbagallo et al. "Scan Chain Partitioning and Re–ordering Based on Layout Information: An Industrial Experience", DATE98: Design, Automation and Test in Europe, Feb. 1998, 5 pages.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–26 are now disclaimed.

* * * * *